(12) United States Patent
Takagaki et al.

(10) Patent No.: US 11,013,127 B2
(45) Date of Patent: May 18, 2021

(54) METHOD FOR PRODUCING CONNECTION SUBSTRATE

(71) Applicant: NGK Insulators, Ltd., Nagoya (JP)

(72) Inventors: Tatsuro Takagaki, Nagoya (JP); Sugio Miyazawa, Kasugai (JP); Akiyoshi Ide, Kasugai (JP)

(73) Assignee: NGK INSULATORS, LTD., Nagoya (JP)

( * ) Notice: Subject to any disclaimer, the term of this patent is extended or adjusted under 35 U.S.C. 154(b) by 303 days.

(21) Appl. No.: 16/108,284

(22) Filed: Aug. 22, 2018

(65) Prior Publication Data

US 2018/0359865 A1 Dec. 13, 2018

Related U.S. Application Data

(63) Continuation of application No. PCT/JP2017/000769, filed on Jan. 12, 2017.

(30) Foreign Application Priority Data

Mar. 11, 2016 (JP) .............................. JP2016-048166

(51) Int. Cl.
*H05K 3/40* (2006.01)
*H05K 3/26* (2006.01)
(Continued)

(52) U.S. Cl.
CPC ............. *H05K 3/40* (2013.01); *H05K 1/0306* (2013.01); *H05K 1/115* (2013.01); *H05K 3/26* (2013.01)

(58) Field of Classification Search
CPC ........ H05K 1/0306; H05K 1/115; H05K 3/26; H05K 3/40; H05K 3/4038
See application file for complete search history.

(56) References Cited

U.S. PATENT DOCUMENTS 5,614,043 A 3/1997 Ritland et al.
5,888,631 A * 3/1999 Sylvester ............ H01L 23/3735
174/256

(Continued)

FOREIGN PATENT DOCUMENTS

JP 62-296496 A 12/1987
JP 06-291435 A 10/1994

(Continued)

OTHER PUBLICATIONS

International Search Report for PCT/JP2017/000769 (2 pgs).

(Continued)

*Primary Examiner* — Carl J Arbes
(74) *Attorney, Agent, or Firm* — Flynn Thiel, P.C.

(57) ABSTRACT

A metal paste is suppled into a through hole of a ceramic substrate and heated to generate a metal porous body. A glass paste is applied on a main surface of the metal porous body while the glass paste is impregnated into open pores of the metal porous body. The glass paste is hardened by heating to form a glass layer on the main surface of the metal porous body and to make the glass paste impregnated into the open pores form glass phases. The glass layer is removed to obtain a connection substrate having a ceramic substrate and through conductors provided in through holes, respectively. The through conductor includes the metal porous body and glass phases.

3 Claims, 8 Drawing Sheets

(51) Int. Cl.
*H05K 1/03* (2006.01)
*H05K 1/11* (2006.01)

(56) References Cited

U.S. PATENT DOCUMENTS

| | | | |
|---|---|---|---|
| 5,922,245 A | 7/1999 | Mohri et al. | |
| 6,093,476 A * | 7/2000 | Horiuchi | H01L 21/486 |
| | | | 428/209 |
| 6,479,763 B1 * | 11/2002 | Igaki | C09J 9/02 |
| | | | 174/260 |
| 7,687,722 B2 * | 3/2010 | Japp | H05K 3/4655 |
| | | | 174/255 |
| 8,304,661 B2 * | 11/2012 | Nomiya | B32B 18/00 |
| | | | 174/258 |
| 9,048,608 B2 * | 6/2015 | Pavlovic | H01R 43/20 |
| 9,161,450 B2 | 10/2015 | Kamakura | |
| 9,282,638 B2 | 3/2016 | Bonkohara et al. | |
| 9,403,023 B2 * | 8/2016 | Markham | A61N 1/3754 |
| 9,414,513 B2 | 8/2016 | Nakagoshi et al. | |
| 9,954,160 B2 | 4/2018 | Ishigami et al. | |
| 2010/0096178 A1 * | 4/2010 | Kim | H05K 3/4061 |
| | | | 174/264 |
| 2015/0351241 A1 | 12/2015 | Hirose et al. | |
| 2015/0357254 A1 | 12/2015 | Mikami | |

FOREIGN PATENT DOCUMENTS

| | | | |
|---|---|---|---|
| JP | 09-046013 A | | 2/1997 |
| JP | 2003-101181 A | | 4/2003 |
| JP | 2005-063708 A | | 3/2005 |
| JP | 2005-093105 A | | 4/2005 |
| JP | 3978905 B | * | 9/2007 |
| JP | 4154913 B2 | | 9/2008 |
| JP | 2010-098291 A | | 4/2010 |
| JP | 2011-176033 A | | 9/2011 |
| JP | 4826319 B | * | 11/2011 |
| JP | 2012-114213 A | | 6/2012 |
| JP | 2013-165265 A | | 8/2013 |
| JP | 2013-219253 A | | 10/2013 |
| JP | 2015-065442 A | | 4/2015 |
| JP | 2015-119165 A | | 6/2015 |
| JP | 5820092 B1 | | 10/2015 |
| JP | 2015-231009 A | | 12/2015 |
| JP | 2016-004973 A | | 1/2016 |
| TW | 201410098 A | | 3/2014 |
| WO | WO 2014/106925 A1 | | 7/2014 |
| WO | WO 2015/141344 A1 | | 9/2015 |

OTHER PUBLICATIONS

International Preliminary Report on Patentability for PCT/JP2017/000769, dated Sep. 11, 2018 (1 pg.).
English translation of Written Opinion of the International Searching Authority for PCT/JP2017/000769, dated Mar. 28, 2017 (6 pgs.).
Taiwan Office Action issued in Taiwan Application No. 106102858, dated Apr. 8, 2020 (6 pages).
U.S. Appl. No. 16/108,317, filed Aug. 22, 2018.
U.S. Appl. No. 16/108,339, filed Aug. 22, 2018.

* cited by examiner

METHOD FOR PRODUCING CONNECTION SUBSTRATE

CROSS-REFERENCE TO RELATED APPLICATIONS

This is a continuation of PCT/JP2017/000769, filed Jan. 12, 2017, which claims the priority of Japanese Patent Application No. 2016-048166, filed Mar. 11, 2016, the entire contents of which are hereby incorporated by reference.

TECHNICAL FIELD

The present invention relates to a method of producing an electrical connection substrate in which a through conductor, such as a via conductor, is formed in a through hole.

RELATED ART STATEMENT

As a substrate for mounting an electronic device, such as a SAW filter, a substrate (via substrate) is used having the structure that a through hole is provided in an insulating substrate, such as ceramic substrate, and the through hole is filled with a conductor to provide a through electrode. Recently, for the reduction in size of a communication apparatus represented by cellular phone, miniaturization and reduction of height is demanded for an electronic device used therein. The reduction of the substrate thickness for the via substrate constituting the device has been further demanded.

Further, for attaining miniaturization, it is necessary to make wirings on a surface of the substrate fine. It is thereby demanded that the size of the through electrode is made smaller and the precision of the position is made finer. Further, as the fine wirings are formed by photolithography or plating, for preventing failure due to the invasion of a liquid chemical during the step of applying a resist or plating, it is particularly demanded that the through electrode is dense and its water-tightness is high.

Various kinds of solutions have been proposed for densifying the through electrode. The solutions, however, aim at relatively thick substrates and through electrodes of a large size. The desired results are not obtained when a thin substrate and a through electrode of a small size are used.

For example, according to patent document 1, the method of forming a conductive protection film on a surface of a porous through electrode is disclosed for preventing the invasion of a resist liquid. When the thickness of an insulating substrate is thin, the permeability of the through hole is high and the strength of the conductive protection film is insufficient so that it does not function as a protection film. Further, separation tends to occur along an interface of a ceramic and a metal due to a difference of thermal expansion.

According to the method of patent document 2, after a porous first conductor is formed as a through electrode, its pores are filled with a second conductor. In the case that a ceramic substrate is used, however, due to a difference of thermal expansion of a metal as a conductor and a ceramic, cracks or warpage of the substrate tends to occur after the substrate is thinned.

According to patent document 3, the method is disclosed that metals containing an active metal are filled in a through hole of a ceramic substrate to form an active metal layer between the ceramic substrate and through electrode and to densify the active metal layer. However, in addition to the problem of the generation of cracks due to the difference in thermal expansion of a ceramic and a metal as described above, the viscosity of a metal solder containing the active metal is very high. It is thereby difficult to fill it completely when the size of the through electrode is small.

According to the method disclosed in patent document 4, a conductive paste containing an expansion agent is used in forming a through electrode. It is, however, difficult to fill all the cavities only with the expansion agent. Particularly in the case that it is thinned, the through electrode cannot be densified.

According to patent document 5, the method of positioning a powdery conductive material in through holes of a ceramic substrate, respectively, and of filling glass paste therein is disclosed. However, cracks or warping due to a difference in thermal expansions of a ceramic and the powdery conductive material tends to occur. Further, as the through hole becomes smaller, it becomes difficult to position the powdery conductive material.

RELATED DOCUMENTS

Patent Documents (Patent document 1) Japanese Patent No. 4154913B
(Patent document 2) Japanese Patent Publication No. 2013-165265A
(Patent document 3) Japanese Patent publication No. 2015-065442A
(Patent document 4) Japanese Patent Publication No. H09-046013A
(Patent document 5) Japanese Patent Publication No. 2015-119165A

SUMMARY OF THE INVENTION

An object of the present invention is, in producing a connection substrate having a ceramic substrate and a through conductor provided in a through hole, to improve the water-tightness of the through hole.

The present invention provides a method of producing a connection substrate, said method comprising the steps of:
providing a ceramic substrate comprising a first main surface, a second main surface and a through hole, supplying a metal paste into said through hole, and forming a metal porous body comprising a main surface by heating;

applying a glass paste on the main surface of the metal porous body and impregnating the glass paste into open pores of the metal porous body;

hardening the glass paste by heating to form a glass layer on the main surface of the metal porous body and form glass phases from the glass paste impregnated into the open pores; and removing the glass layer to obtain a connection substrate comprising the ceramic substrate and a through conductor provided in the through hole;

wherein the through conductor comprises the metal porous body and glass phases.

Effects of the Invention

According to the present invention, a glass paste is applied onto a main surface of a metal porous body, and the glass paste is impregnated into open pores of the metal porous body and fired. Then, the glass layer remaining on the side of the first main surface of the ceramic substrate is removed to expose the through conductor to the side of the first main surface.

According to the present invention, as the through conductor in the through hole of the ceramic substrate is composed of the metal porous body and glass phases, a difference between thermal expansions of the through conductor and ceramic is relaxed to prevent the generation of cracks or warping. Moreover, the glass paste is filled into the open pores of the metal porous body from the side of the first main surface and then fired to generate the glass phases. The water-tightness can be assured by the glass phases on the side of the first main surface of the ceramic substrate, so that the water-tightness of the connection substrate can be improved as a whole.

EMBODIMENTS FOR CARRYING OUT THE INVENTION

The present invention will be described further in detail, appropriately referring to drawings.

Figure 1A:
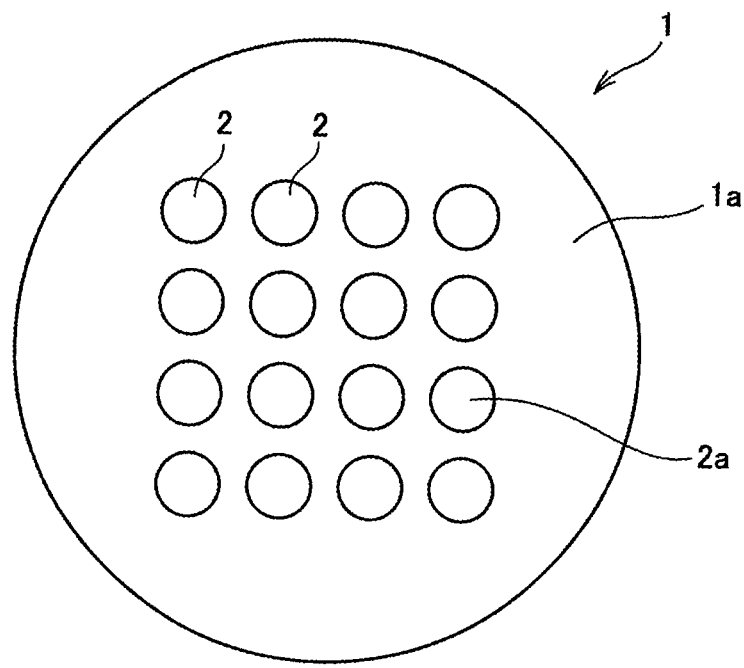
FIG. 1(a) is a plan view schematically showing a ceramic substrate 1 with through holes arranged therein.
Figure 1B:
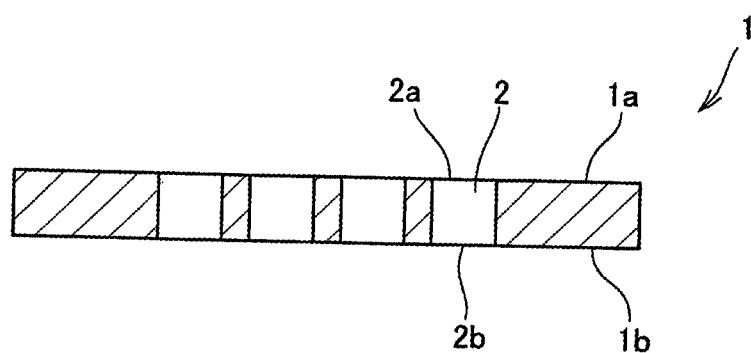
FIG. 1(b) is a cross-sectional view showing the ceramic substrate 1.

As shown in FIG. 1, a first main surface 1a and a second main surface 1b are provided in a ceramic substrate 1, and many through holes 2 penetrating through the main faces 1a and 1b are formed. Openings 2a and 2b are provided on the sides of the first main surface 1a and second main surface 1b, respectively, in the through hole 2.

Figure 2A:
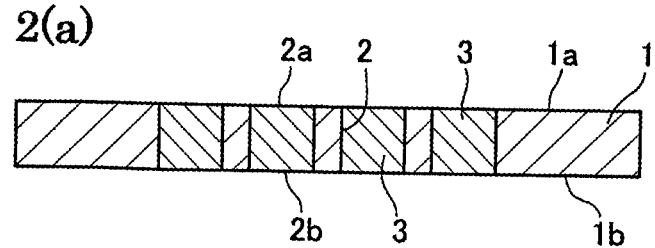
FIG. 2(a) shows the state that a metal paste 3 is filled in the through holes of the ceramic substrate 1.
Figure 2B:
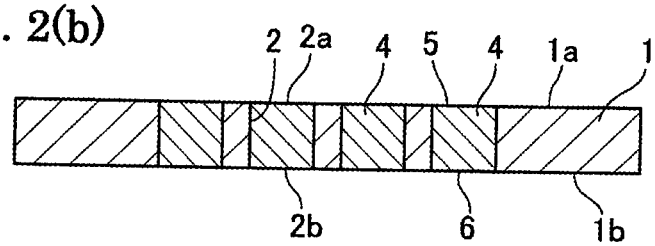
FIG. 2(b) shows the state that the metal paste 3 is fired to form a metal porous body 4.

Then, as shown in FIG. 2(a), a metal paste 3 is filled in the opening 2 of the ceramic substrate 1. Then, the metal paste 3 is heated to fire the metal paste and generate a metal porous body 4 in the through hole 2, as shown in FIG. 2(b). 5 represents a first main surface of the metal porous body 4, and 6 represents a second main surface of the metal porous body 4.

Figure 2C:
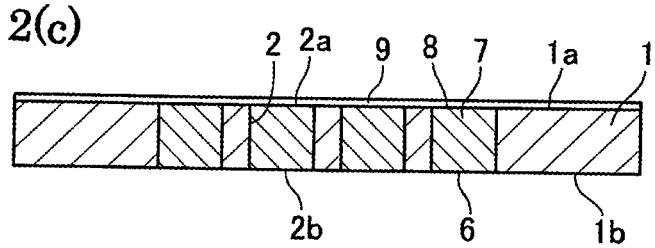
FIG. 2(c) shows the state that a glass layer 9 is formed on a first main surface 1a of the ceramic substrate 1.

Then, a glass paste is applied on the first main surface 1a of the ceramic substrate 1 to form a glass paste layer. At the same time, the glass paste applied on the first main surface 5 of the metal porous body 4 is impregnated into open pores of the metal porous body. 4. At this state, the glass paste is heated and fired to harden the glass. By this, as shown in FIG. 2(c), a glass layer 9 is formed on the first main face 1a of the ceramic substrate 1. At the same time, the glass paste impregnated into the open pores of the metal porous body is hardened to generate glass phases to thereby form a through conductor 7 in the through hole. Further, 8 represents a first main surface of the through conductor 7.

The glass layer 9 is then removed so that the through conductor is exposed to the side of the first main surface of the ceramic substrate to provide a connection substrate. At this time, preferably, the first main surface 1a of the ceramic substrate 1 is further polished to form a polished surface 1c, so that a connection substrate 10 is obtained, as shown in FIG. 2(d).

Figure 2D:
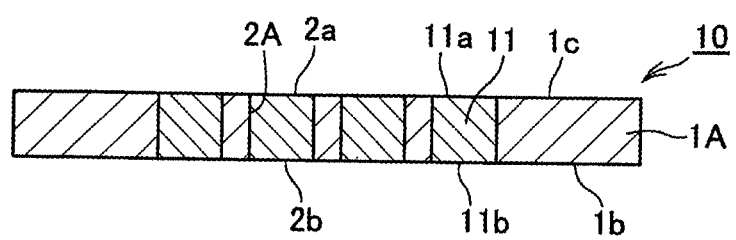
FIG. 2(d) shows the state that the glass layer 9 is removed.
Figure 3A:
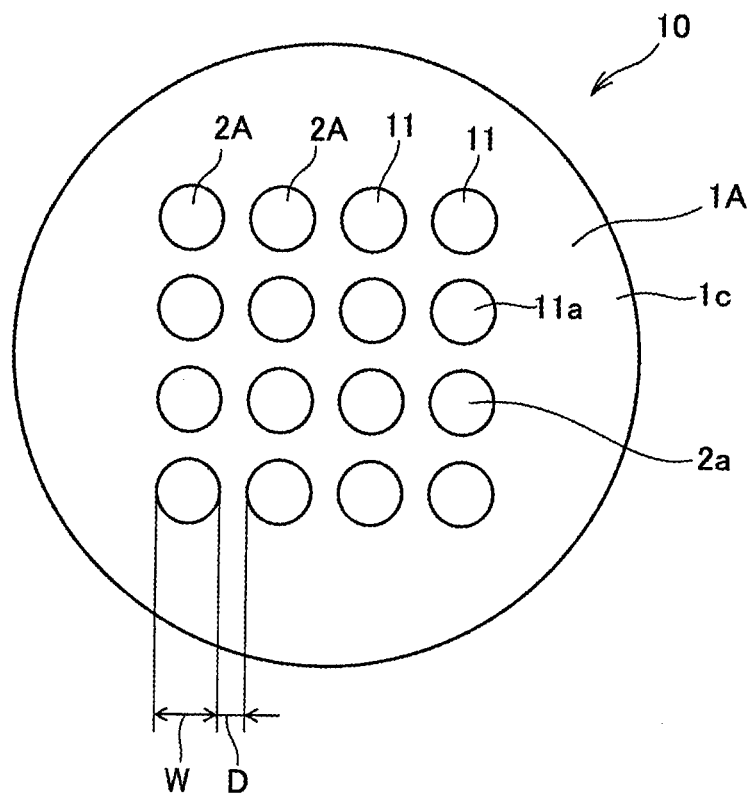
FIG. 3(a) is a plan view schematically showing a connection substrate 10 with through conductors 11 formed in through holes 2A.
Figure 3B:
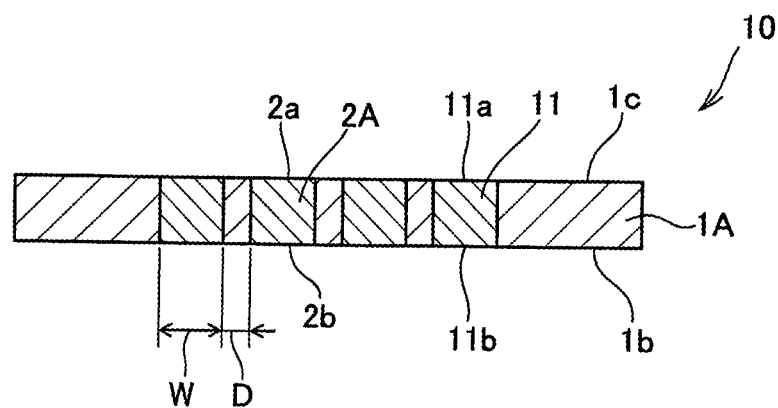
FIG. 3(b) is a cross-sectional view showing the connection substrate 10.

As shown in FIG. 2(d) and FIGS. 3(a) and (b), in a ceramic substrate 1A of the connection substrate 10, the through conductor 11 is filled in each of the through holes 2A. 11a represents a first main surface of the through conductor 11, and 1ib represents a second main surface of the through conductor 11.

The characteristic of the method of production of the present invention will be described further.

As shown in FIG. 2(b), the metal paste is fired to form the metal porous body 4 in the through hole 2. According to the present example, the metal porous body 4 extends from the first main surface 1a to the second main surface 1b of the ceramic substrate 1. 5 represents a first main surface and 6 represent a second main surface of the metal porous body.

Figure 4:
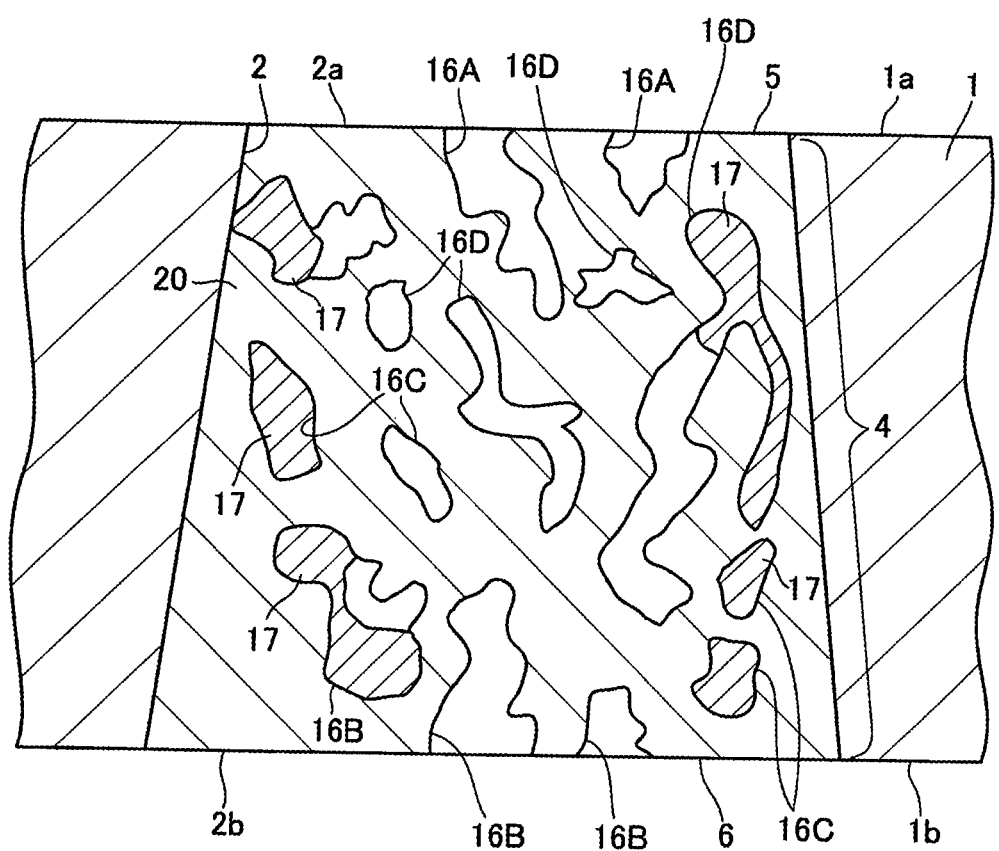
FIG. 4 is a schematic view showing the structure of a metal porous body 4 formed in the through hole.

As shown in FIG. 4, the metal porous body 4 is composed of a metal matrix 20 having pores 16A, 16B, 16C and 16D. Besides, when a glass component is added into the metal paste, a part of the pores is filled with glass phases 17. The pores generated in the matrix include first open pores 16A and 16D opening at the first main surface 5, second open pores 16B opening at the second main surface 6, and closed pores 16C which are not opened at the main surfaces 5 and 6. Further, the open pores 16A are opened at the first main surface 5 on the cross section of FIG. 4. On the other hand, the open pores 16D are not opened at the first main face 5 on the cross section of FIG. 4 and are opened at the first main surface 5 through routes not shown in the cross section. The open pores 16A and 16D are thus distinguished.

According to the state shown in FIG. 4, a part of each of the open pores 16A, 16B, 16C and 16D is filled with the glass phase 17 and the remaining parts are left as the spaces.

Then, when the ceramic substrate is subjected to a water-tightness test, the leakage of water may be observed from the first main surface 1a to the second main surface 1b. The reasons are considered as follows. It is speculated that the first open pores 16A, 16D opening at the first main surface 5 and the second open pores 16B opening at the second main surface 6 partly communicate with each other.

Here, as described above, the present inventors reached the idea of applying the glass paste on the side of the first main surface 1a to form the glass layer and of impregnating a part of the glass paste into the open pores 16A and 16D from the side of the first main surface 5.

Figure 5:
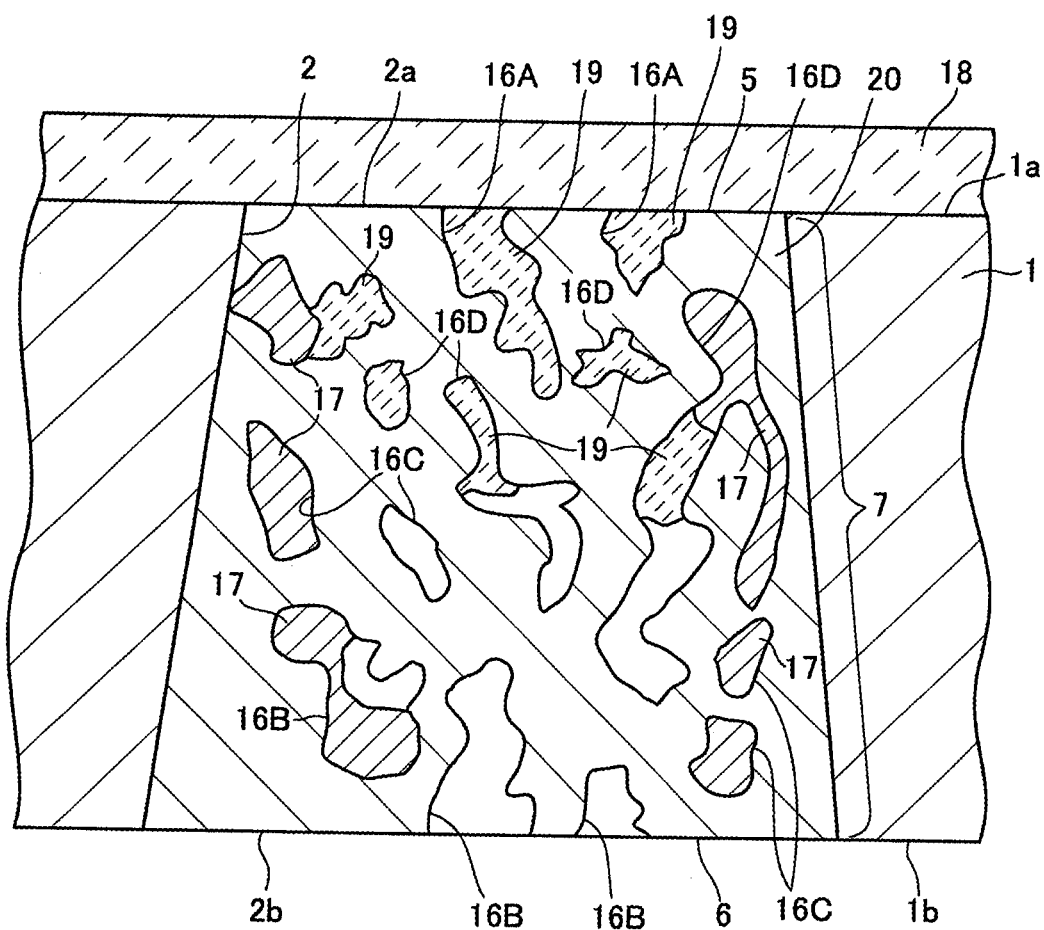
FIG. 5 is a schematic view showing glass phases 19 impregnated into through holes 16A of the metal porous body 4 and a glass layer 18 formed on the first main surface 1a of the ceramic substrate 1.

As a result, as shown in FIG. 5, the glass paste is impregnated into the open pores 16A and 16D opening at the first main surface 5 from the side of the first main surface. In this state, the glass paste is fired so that a glass layer 18 is formed on the first main surface 1a and, at the same time, the glass phases 17 are formed in the open pores 16A and 16D. In a part of the open pores, glass phases 17 originally included in the metal porous body and glass phases 19 generated by the impregnation and firing of the glass paste may co-exist.

Then, by impregnating the molten glass from the side of the first main surface to the open pores of the metal porous body, at least a part of the first open pores on the side of the first main surface is clogged with the glass phases 19. As a result, open pores communicating with the first main surface 5 and second main surface 6 are not left, so that the water-tightness can be considerably improved.

Figure 6:
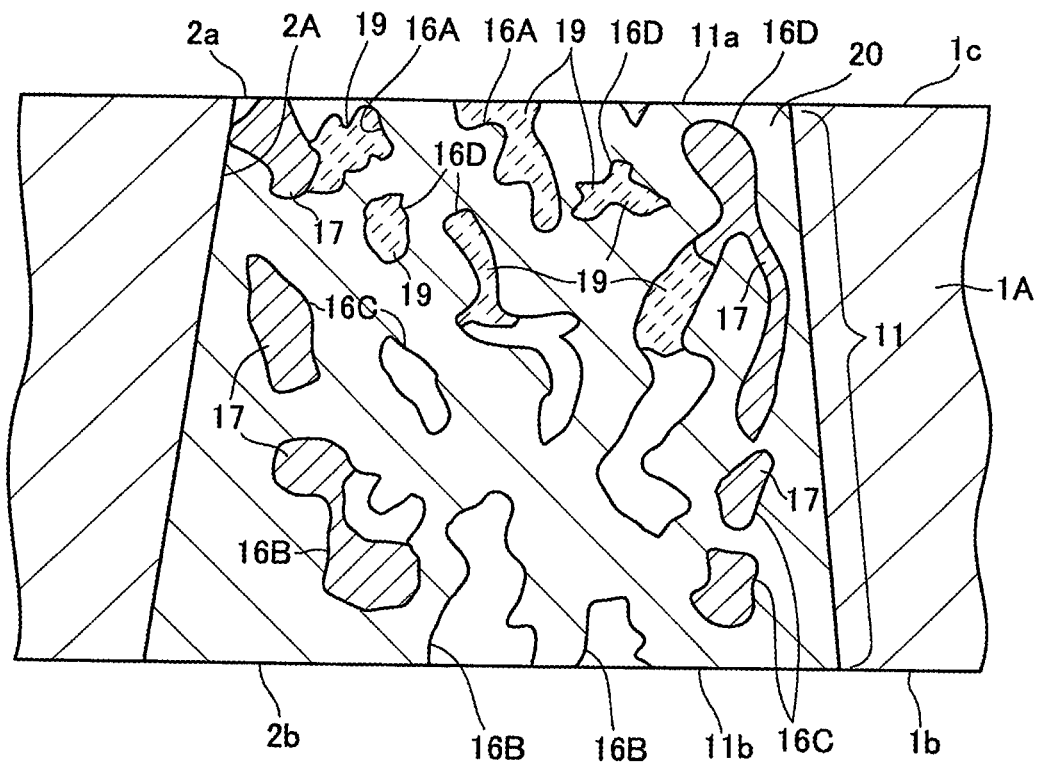
FIG. 6 is a schematic view showing the structure of the through conductor 11 after the glass layer is removed.

In the state shown in FIG. 5, however, as the metal porous body is covered by the glass layer 18, both sides of the ceramic substrate 1 cannot be electrically conductive by the through conductor 7. Thus, according to the present invention, the unnecessary glass layer 18 is removed as shown in FIG. 6, so that the through conductor is exposed to the side of the first main surface. At this time, the first main surface of the ceramic substrate may preferably be subjected to polishing to form a polished surface, so that the through conductor can be further assuredly exposed and the exposed surface can be made flat.

In this state, as shown in FIG. 6, a polished surface 1c is formed in a ceramic substrate 1A and the thickness of the ceramic substrate 1A is made smaller than that before the polishing. Further, the through conductor 11 is formed in the through hole 2A. Further in this state, the open pores of the through conductor, at least on the side of the first main surface 11a, are clogged with the glass phases 19. As a result, the open pores communicating with the first main surface 11a and second main surface 11b are not left, so that the water-tightness is considerably improved.

The constituents of the present invention will be described further below.

According to a preferred embodiment, the thickness of the ceramic substrate is 25 to 150 μm and the diameter W of the through hole is 20 to 70 μm. The present invention is particularly useful for such thin and small connection substrates.

The diameter W of the through hole formed in the ceramic substrate may more preferably be 25 μm or larger from the viewpoint of ease of molding. A distance D of the adjacent through holes 2 (distance between through holes which are nearest to each other) may preferably be 50 μm or larger and more preferably be 100 μm or larger from the viewpoint of preventing fracture or cracks. Further, the distance D between the adjacent through holes 2 may preferably be 1000 μm or smaller and more preferably be 500 μm or smaller, from the viewpoint of improving the density of the through holes.

The method of forming the through holes in the ceramic substrate is not particularly limited. For example, the through holes may be formed by subjecting a green sheet of the ceramic substrate to processing by laser or a pin. Alternatively, a blank substrate made of a ceramic material is produced, and the through holes may be formed by laser processing of the blank substrate.

As ceramic materials for forming the ceramic substrate, $Al_2O_3$, AlN, $ZrO_2$, Si, $Si_3N_4$ and SiC may be listed.

According to the present invention, the metal paste is supplied into the through hole and heated to generate the metal porous body. As a metal mainly constituting the metal paste, Ag, Au, Cu, Pd or the mixtures thereof is listed. Further, a glass component may be added to the metal to generate a paste. This glass component includes $SiO_2$, $Al_2O_3$, bismuth oxide, zinc oxide, vanadium oxide, tin oxide, tellurium oxide, an alkaline metal oxide and fluorine.

Although the temperature of firing of the metal paste is appropriately selected depending on the kind of the paste, it may be 500 to 900° C., for example.

Next, the glass paste is applied on the first main surface of the metal porous body and the glass paste is impregnated into the open pores of the metal porous body. At this time, the glass paste may be applied over the entirety of the first main surface of the ceramic substrate. Alternatively, the glass paste may be applied only on the first main surface of the metal porous body and the glass paste may not be applied on the remaining part of the surface of the ceramic substrate, by means of screen printing or the like.

The glass paste is then hardened by heating, so that the glass layer formed on the main surface of the metal porous body and the glass paste impregnated into the open pores are made the glass phases. Although the temperature of firing of the glass paste is selected depending on the kind of the paste, it may be 500 to 900° C., for example.

Then, at least the glass layer on the metal porous body is removed to obtain a connection substrate having the ceramic substrate and through conductors provided in the through holes. In this state, although it is sufficient that at least the glass layer is removed to expose the through conductor, the first main surface of the ceramic substrate is preferably polished. Then, predetermined wirings, pads or the like are formed on each of the main surfaces 11a and 11a of the ceramic substrate. Further, the ceramic substrate is made into an integrated relay board.

The ceramic substrate is preferably subjected to precise polishing. For this precise polishing, CMP (Chemical Mechanical Polishing) is generally used. As a polishing slurry for CMP, a slurry including an alkaline or neutral solution with abrasives having a particle size of 30 nm to 200 nm dispersed is used. As the materials of the abrasives, silica, alumina, diamond. zirconia and ceria are listed and may be used alone or in combination. Further, as the polishing pad, a hard urethane pad, non-woven pad or suedo pad is listed.

EXAMPLES

Example 1

Connection substrates were produced as described referring to FIGS. 1 to 6.

Specifically, a slurry was produced by mixing the following components.
(Powdery Raw Material)

| | |
|---|---|
| α-alumina powder having a specific surface area of 3.5 to 4.5 $m^2$/g and an average primary particle size of 0.35 to 0.45 μm (alumina purity of 99.99 percent) | 100 mass parts |
| MgO (magnesia) | 250 ppm |
| $ZrO_2$ (zirconia) | 400 ppm |
| $Y_2O_3$ (yttria) | 15 ppm |
| (Dispersing medium) | |
| 2-ethyl hexanol | 45 weight parts |
| (Binder) | |
| PVB (polyvinyl butyral) resin | 4 weight parts |
| (Dispersing agent) | |
| High molecular surfactant | 3 weight percent |
| (Plasticizer) | |
| DOP | 0.1 weight parts |

The slurry was then shaped into a tape by a doctor blade method to a thickness corresponding with the thickness after sintering of 250 μm, and the tape was cut into pieces each having a diameter corresponding with a diameter φ of 100 mm after sintering. The thus obtained powder-shaped body was calcined (preliminary sintering) in atmosphere at 1240° C. The calcined body was then mounted on a plate made of molybdenum and then sintered by holding under an atmosphere of hydrogen 3: nitrogen 1 at a temperature elevation rate of 50° C./h from 1300° C. to 1550° C. and a holding time of 2.5 hours at 1550° C., providing a blank substrate.

The blank substrate was subjected to laser processing under the following conditions to form through holes having the following dimensions.

| | | |
|---|---|---|
| $CO_2$ laser: | Wavelength | 10.6 μm |
| Pulse: | 1000 Hz - On time | 12 μs |
| Laser mask size: | | 0.9 mm |
| Number of shots: | | 40 counts |
| Size W of through hole: | | 0.65 mm |
| Distance D of through hole: | | 0.3 mm |
| Number of through holes: | | 40000 counts/unit |

Then, during the laser processing, droth attached onto the substrate surface was removed by grinding with a grinder, and the substrate was then subjected to annealing under an atmosphere at 1300° C. for 5 hours to obtain a ceramic substrate having a thickness of 180 μm.

Then, embedded printing of Ag paste was performed in the through holes of the ceramic substrate. The Ag paste contained 10 percent or less of a glass component. Thereafter, the firing was performed at 750° C. to generate the metal porous bodies in the through holes, respectively. Then, a glass paste of a borosilicate glass of a low melting point was printed on the first main surface of the ceramic substrate and the glass paste as molten at 670° C.

The glass layer remaining on the surface was then removed by polishing to obtain a connection substrate. Specifically, the substrate was subjected to grinding by a grinder with the substrate adhered onto an alumina paste. Both surfaces of the substrate were subjected to lapping with a diamond slurry. The particle size of the diamond was 3 μm. CMP processing by $SiO_2$ and diamond abrasives was finally performed. Thereafter, the substrate was separated from the alumina plate, the processing as described above was performed on the main surface on the opposite side, and cleaning was performed to obtain the connection substrate.

Figure 7:
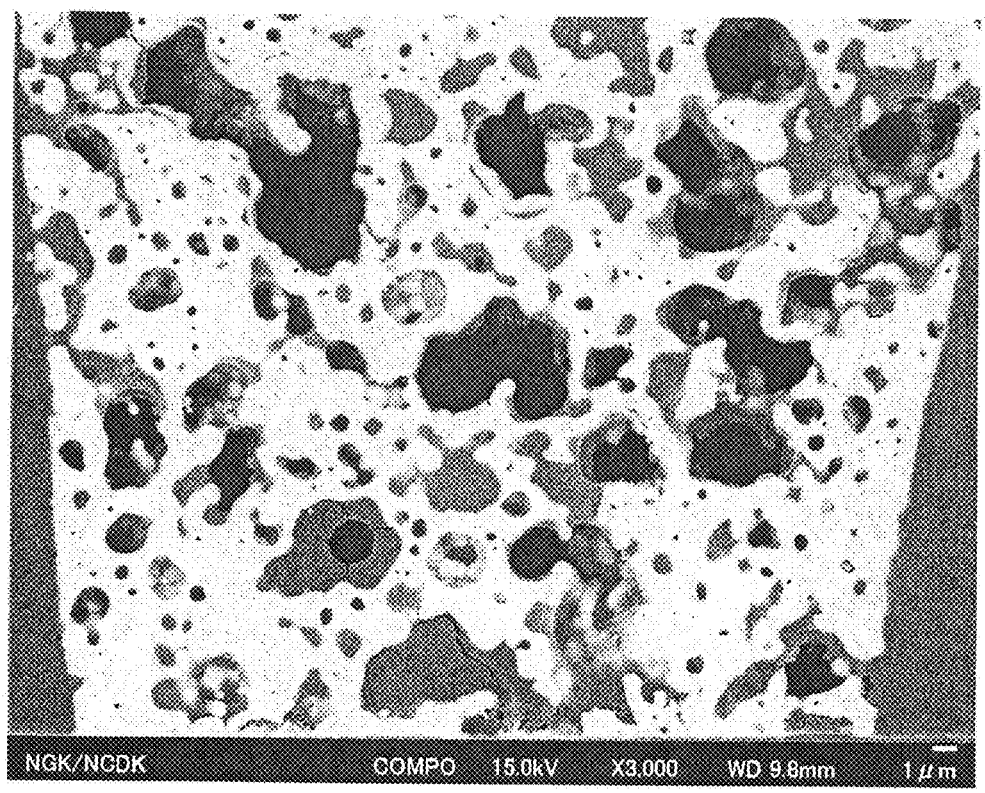
FIG. 7 is a photograph of the through conductor of the example of the present invention.

FIG. 7 shows an enlarged photograph of the thus obtained through conductor.

Further, cracks and warping were not observed in the ceramic substrate of the thus obtained connection substrate.

Figure 8:
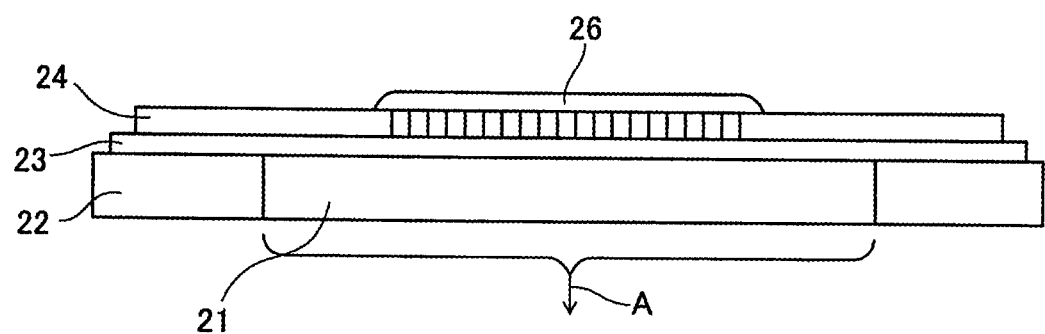
FIG. 8 is a schematic view illustrating a method of testing water-tightness.

The water-tightness of the through conductor of the thus obtained connection substrate was confirmed by the method described referring to FIG. 8.

That is, a porous plate 21 was fixed on a table 22, a dust-free paper 23 was mounted on the table 22, and a sample 24 of the ceramic substrate was mounted thereon. Water 26 was dropped on the through holes of the ceramic substrate 24, and water was sucked as shown by arrow A. It was then confirmed whether water was attached onto the dust-free paper or not.

As a result, the number of through conductors with the leakage of liquid observed was proved to be one, with respect to 40000 counts of the through conductors provided in the single ceramic substrate.

Comparative Example 1

Ag paste was embedded into the respective through holes of the ceramic substrate the same as that in Example 1. The Ag paste used was the same as that used in Example 1. Thereafter, sintering was carried out at 750° C. to form the metal porous bodies in the through holes, respectively.

Then, both main faces of the ceramic substrate were subjected to precise polishing, without performing the step of printing the glass paste on the first main face of the ceramic substrate. A connection substrate was thus obtained.

The water-tightness test was then performed the same as in Example 1. As a result, the leakage of liquid in substantially all of 40000 counts of the through conductors provided in the single ceramic substrate was observed.

What is claimed is:

1. A method of producing a connection substrate, said method comprising the steps of:
   providing a ceramic substrate comprising a first main surface, a second main surface and a through hole, supplying a metal paste into said through hole, and forming a metal porous body comprising a first main surface and a second main surface by heating;
   applying a glass paste on said first main surface of said metal porous body while said glass paste is impregnated into open pores of said metal porous body from said first main surface of said metal porous body;
   hardening said glass paste by heating to form a glass layer on said first main surface of said metal porous body and glass phases from said glass paste impregnated into said open pores; and
   removing said glass layer from said first main surface of said metal porous body to expose said first main surface of said metal porous body and thereby obtain a connection substrate comprising said ceramic substrate and a through conductor provided in said through hole;
   wherein said through conductor comprises said metal porous body and said glass phases.

2. The method of claim 1, wherein said glass layer is removed and said first main surface of the said ceramic substrate is made a polished surface by polishing in said step of removing said glass layer.

3. The method of claim 1, wherein said ceramic substrate has a thickness of 25 to 150 μm and said through hole has a diameter of 20 to 70 μm.

* * * * *